United States Patent
Donaldson et al.

(10) Patent No.: US 6,576,909 B2
(45) Date of Patent: Jun. 10, 2003

(54) ION GENERATION CHAMBER

(75) Inventors: Gary A. Donaldson, Hinesburg, VT (US); Donald W. D. Rakowski, Milton, VT (US); Nick G. Selva, Essex Junction, VT (US)

(73) Assignee: International Business Machines Corp., Armonk, NY (US)

( * ) Notice: Subject to any disclaimer, the term of this patent is extended or adjusted under 35 U.S.C. 154(b) by 283 days.

(21) Appl. No.: 09/796,194

(22) Filed: Feb. 28, 2001

(65) Prior Publication Data

US 2002/0117637 A1 Aug. 29, 2002

(51) Int. Cl.⁷ .................................................. H01J 37/36
(52) U.S. Cl. .............. 250/426; 250/492.21; 250/423 R; 250/425
(58) Field of Search ........................ 250/492.21, 423 R, 250/425, 426

(56) References Cited

U.S. PATENT DOCUMENTS

| | | | |
|---|---|---|---|
| 5,466,942 A | 11/1995 | Sakai et al. ............... | 250/492.2 |
| 5,518,593 A | * 5/1996 | Hosokawa et al. .... | 204/192.12 |
| 5,633,506 A | 5/1997 | Blake ...................... | 250/492.2 |

* cited by examiner

Primary Examiner—John R. Lee
Assistant Examiner—Nikita Wells
(74) Attorney, Agent, or Firm—Francis J. Thornton; Robert A. Walsh

(57) ABSTRACT

An ion generator chamber, for an implantation apparatus, having its interior walls surfaces knurled or roughened so that any of the materials used in the chamber cannot deposit onto the interior wall surfaces in a size sufficiently large enough to adversely affect the operation of the chamber, if the deposits peel off the interior walls of the chamber. By limiting the size of any deposits on interior chamber walls, the invention extends the average life of the filaments used in the chamber as well as extending the average time between any necessary cleaning of the inner chamber walls thereby extending the operating life of the chamber.

11 Claims, 4 Drawing Sheets

ION GENERATION CHAMBER

FIELD OF THE INVENTION

This invention relates generally to charge particle beam techniques and devices for solid state device fabrication and more particularly to an ion implantation apparatus that uses an ion source chamber having a uniquely formed interior surface and longer life.

BACKGROUND OF THE INVENTION

Ion implantation tools are well known to the prior art. Such tools have been and are still used in the production of semiconductor integrated circuits and other solid state devices.

Broadly speaking, these ion implantation tools are designed to generate an ion beam, accelerate it, define it and manipulate it so that the generated ions can be implanted beneath the surface of the device, e.g., the semiconductor substrate, against which the ion beam is directed. The implanted ions are thus used to alter the characteristics of the substrate.

As is well known, in such an apparatus, a selected material is introduced into an ion generation chamber or arc chamber preferably in gaseous form. In this ion generation chamber, using known techniques, the gas is energized and formed into a high density plasma from which ions can be extracted. By using suitable electrostatic and/or magnetic forces, ions of the material are extracted from the plasma, accelerated, focused by a so called charged particle optical system and directed against the surface of the solid state device, in a controlled manner, so that the ions in the beam can be controllably implanted into the solid state device where the implanted ions will create selected characteristics or effects.

More particularly, the formation of the plasma in the ion generation chamber is accomplished by introducing the selected elements or compounds, preferably in a heated gaseous form, into the chamber between a heated filament and a reflector plate and in the presence of a magnetic field. In the chamber the electrons, thermionically emitted from the filament, are further energized and cause to oscillate. These oscillating, energized elections when colliding with the gas particles will to ionize the particles and a plasma is formed. Once the plasma is formed, the positive ions can be extracted therefrom, by an extraction electrode, and formed into a beam.

The reflector and interior walls of these ion generation chambers are highly polished and therefore very smooth. Because the chamber walls are at a temperature lower that of the gaseous materials forming the plasma in the critical stages and in equilibrium states, some of the gaseous material, introduced into the chamber as well as material as well as matter sputtered from the filament will condenses and form solid deposits on the relatively cooler chamber walls. Also it should be noted that the deposition rate may be excessive if there is a change in the pressure of the source feed material which is normally in the range of 2 to 5 $\mu$Torr. The polished surface of the chamber walls provides a particularly compliant environment for uniform grain growth of the deposited material. This means that such deposits are usually formed as dendrites. More over because these surfaces are highly polished, as these condensates or deposits get larger and thicker, the high temperature, in the chamber, causes the deposits to peel away from the chamber walls as large flakes. These flakes can drastically shorten the life of the chamber. For example, if a sufficiently large enough flake falls onto the coils of the filament it will reduce the amount of emitted electrons and can cause premature failure of the emitter. If the flakes are even larger, they can short circuit the filament or the reflector to the chamber walls causing a complete collapse of the generated plasma in the chamber.

Such early failures not only interrupt the work schedule, with its attendant costs, but also result in a higher scrap rate in the product being produced. As integrated circuits continue to increase in complexity, it becomes increasingly expensive for manufacturers to continue to suffer such premature failures in their ion implantation equipment. To avoid this problem, manufacturers now shorten their production runs and frequently dismantle the chambers to clean the interior chamber walls of these deposits before they can flake off and damage the equipment.

Therefore, there are compelling economic reasons to avoid early failures in the ion generation chamber due to such flakes. This will not only extend the life of the present ion generation chambers but will also extend the length of the production cycle between the necessary chamber cleaning cycles now required.

It thus becomes desirable that means be found to avoid the flaking problems now found in such ion generation chambers.

SUMMARY OF THE PRESENT INVENTION

The present invention is therefore directed to a unique ion generator or arc chamber for use in an ion implantation apparatus in which the inner surface of the chamber walls is treated to prevent any condensates or deposits of the materials used in the chamber from achieving a size sufficient large enough to adversely affect the operation of the chamber, if the deposits peel of the interior walls of the chamber.

The unique ion generation chamber of the present invention accomplishes this desirable result by providing a roughened, serrated or knurled surface on the interior walls that will prevent deposited materials from growing to a size such that any flakes of such deposits that may separate from the interior walls will not adversely affect the operation of the chamber.

By limiting the size of such flakes, the invention extends the average life of the filaments used in the chamber as well as the average time between cleaning of the inner chamber walls. The present invention thus improves the efficiency of the ion implantation apparatus.

Ion generation chambers having smooth interior surfaces, as taught by the prior art, generally have a useful life of between 160 and 190 hours before the filament burns out, or gets shorted. Actual tests run with an ion generation chamber having roughened interior walls, in accordance with the present invention, were found to have useful lives in excess of 400 hours.

The present invention was particularly efficacious when the germanium based gases are used.

The invention is directed toward an ion implantation apparatus or implanter comprising an ion generation or arc chamber having inwardly facing surfaces with two electrodes in the chamber, an inlet for introducing a feed material to be ionized, an outlet for ionizing the feed material within the chamber wherein the inner surfaces of the chamber have roughened, serrated or knurled surfaces to prevent the feed material to forming flakes large enough to cause short circuits in the chamber.

Therefore, it is an object of the present invention to extend the life of filaments in ion generation chambers.

It is a further object of the invention to eliminate unnecessary cleaning of the interior walls of ion generation chambers.

It is a still further object of the invention to improve the output of ion implantation machines.

These objects, features and advantages of the present invention will become further apparent to those skilled in the art from the following detailed description taken in conjunction with the accompanying drawings wherein:

DESCRIPTION OF THE PREFERRED EMBODIMENT

Figure 1:
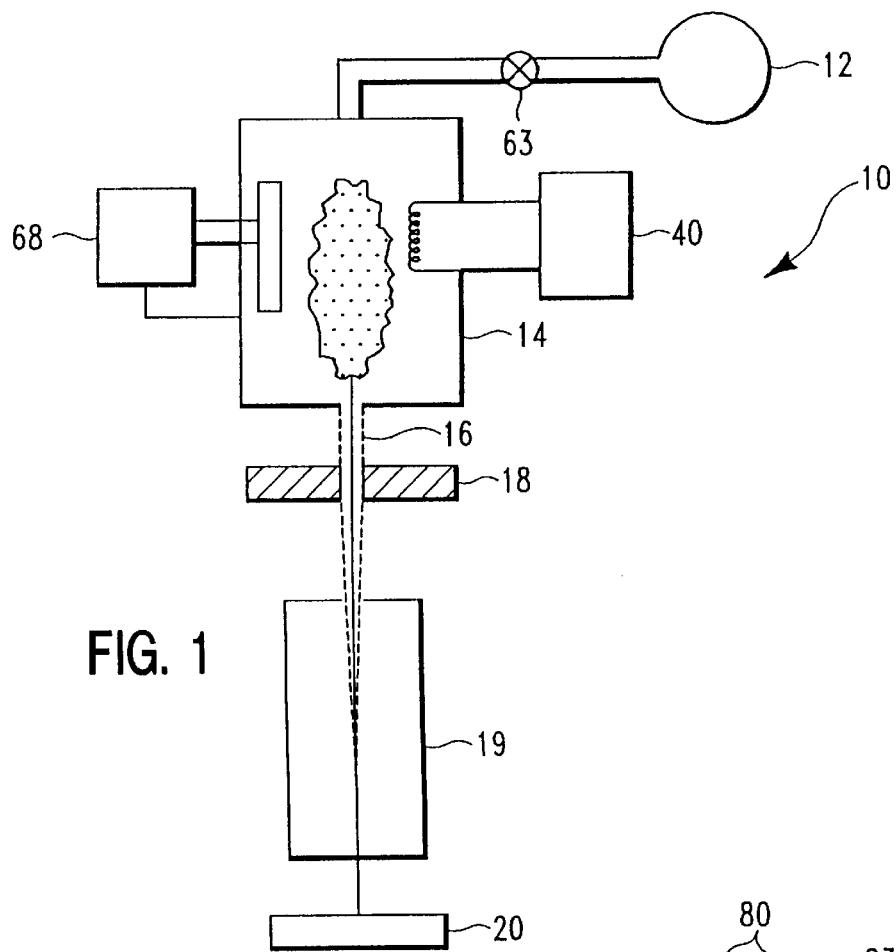
FIG. 1 is a schematic view overall view of an ion implantation apparatus employing the present invention.
Figure 4:
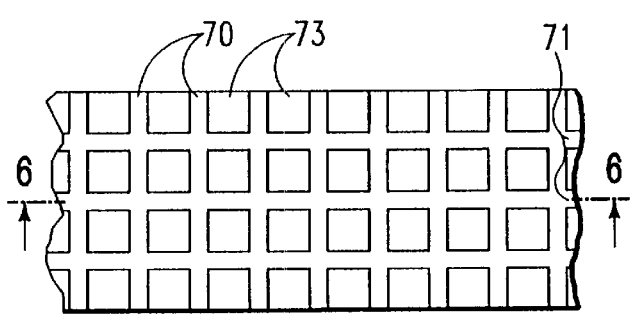
FIG. 4 is a plan view of a portion of the inner surface of one of the walls of the chamber shown in FIG. 2 illustrating a first embodiment of the invention.
Figure 6:
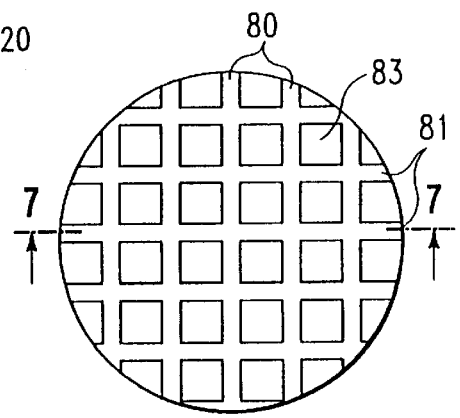
FIG. 6 is a plan view of the reflector electrode in the chamber shown in FIG. 2.
Figure 5:
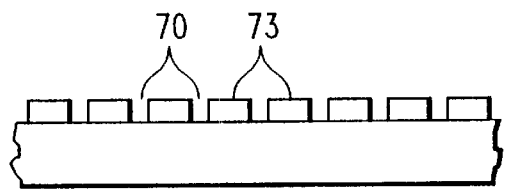
FIG. 5 is a profile of the surface shown in FIG. 4 taken along the lines 5–5.
Figure 7:
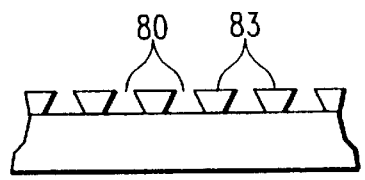
FIG. 7 is a profile of the surface shown in FIG. 6 taken along the lines 7–7 showing a different embodiment of the invention.
Figure 2:
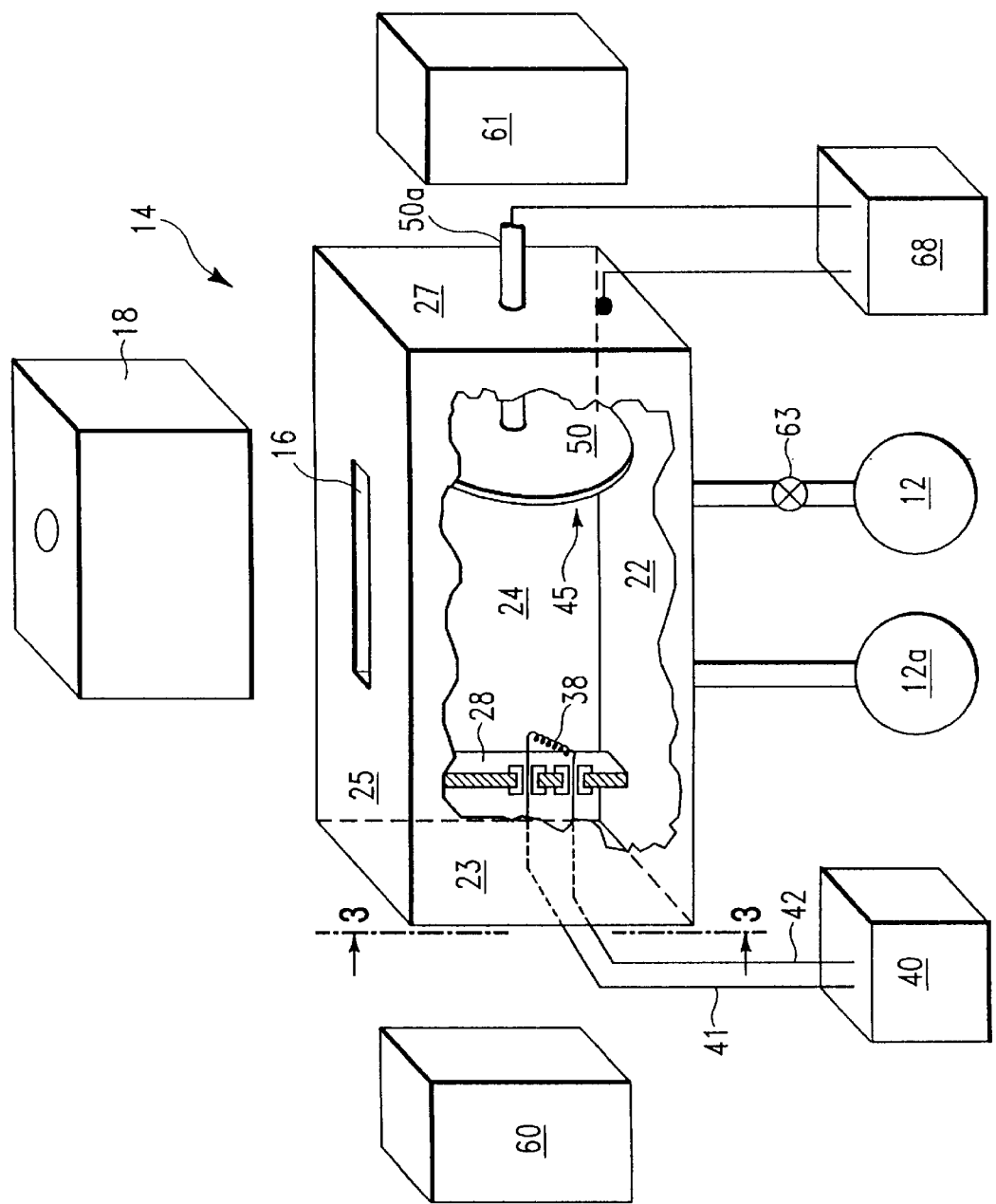
FIG. 2 is a partially sectioned isometric drawing of an ion generation chamber.
Figure 3:
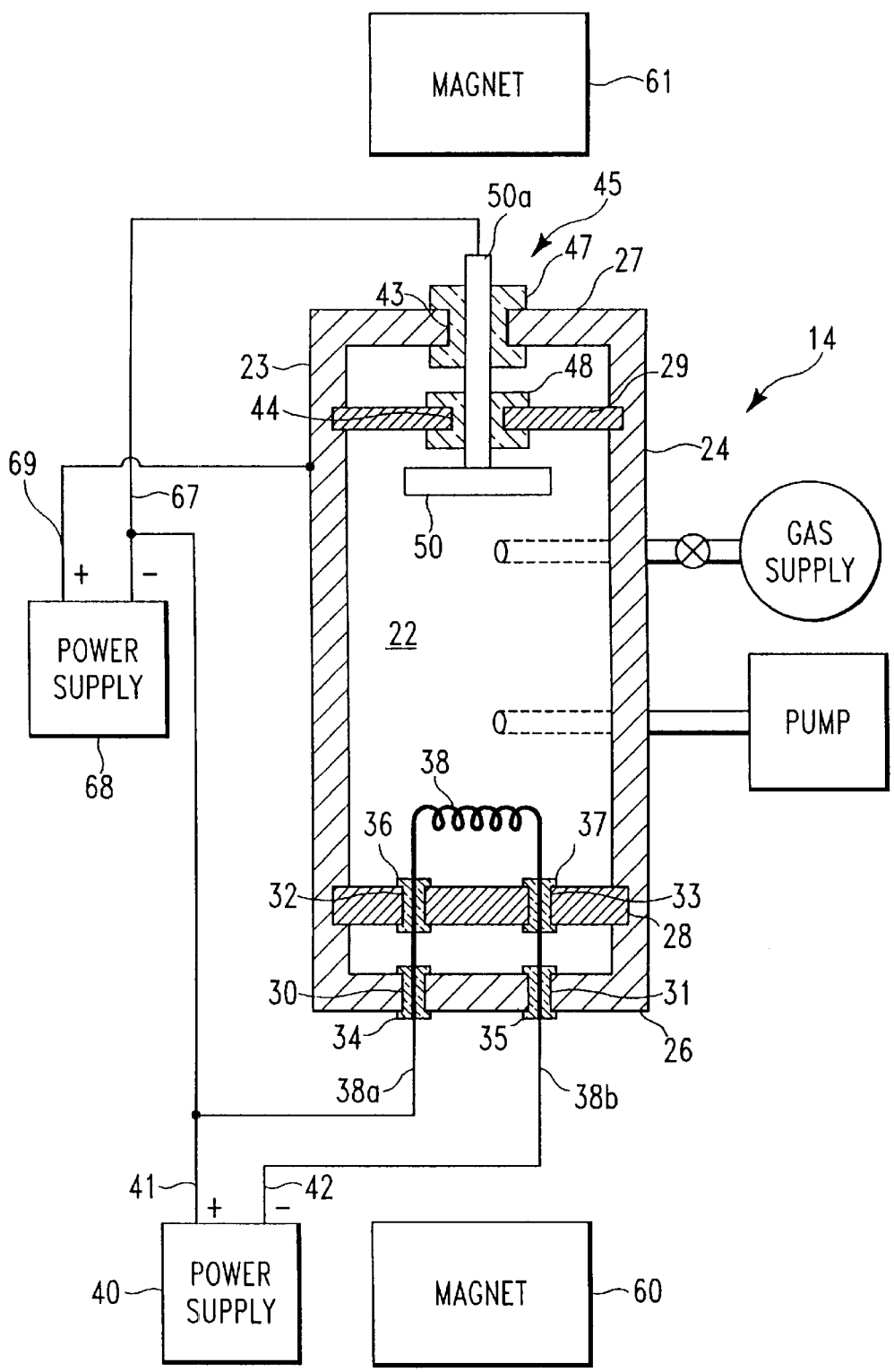
FIG. 3 is a sectional view of the chamber of FIG. 2 taken along the lines 3–3.
Figure 8:
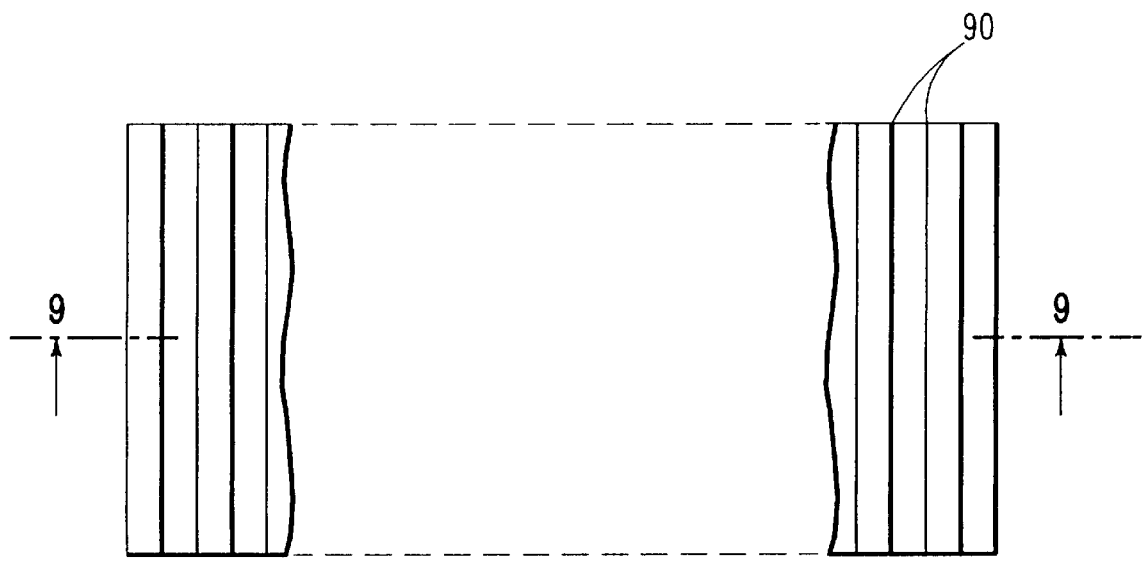
FIG. 8 is a plan view of a portion of the inner surface of one of the walls of the chamber shown in FIG. 2 illustrating a still another embodiment of the invention.
Figure 9:
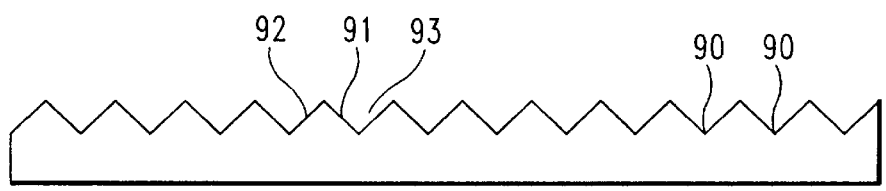
FIG. 9 is a profile of the surface shown in FIG. 8 taken along the lines 9–9.
Figure 10:
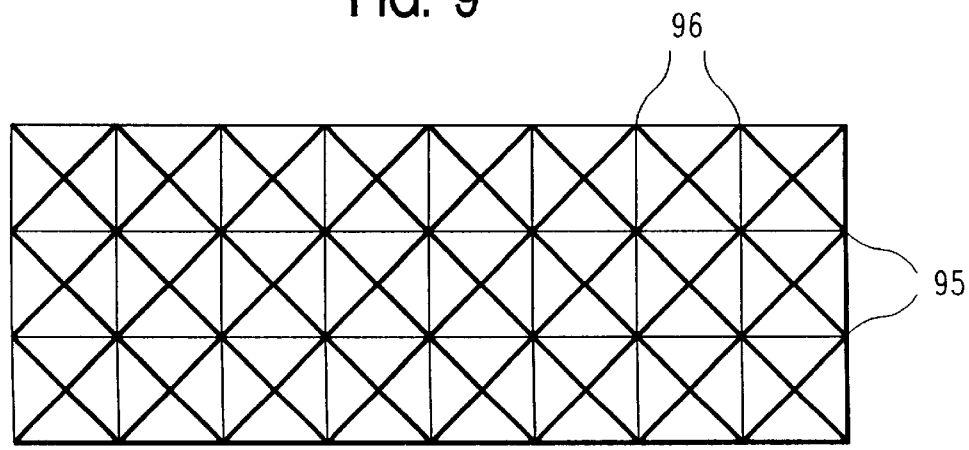
FIG. 10 is a plan view of a surface treated to produce pyramids on the surface.

A full appreciation of the features and advantages of the present invention can best be gained by reference to the drawings and more particularly to the FIGS. 1 through 10. FIG. 1 is a schematic view overall view of an ion implantation apparatus employing the present invention; FIG. 2 is a partially sectioned isometric drawing of an ion generation chamber; FIG. 3 is a sectional view of the chamber of FIG. 2 taken along the lines 3–3; FIG. 4 is a plan view of a portion of the inner surface of one of the walls of the chamber shown in FIG. 2 illustrating a first embodiment of the invention; FIG. 5 is a profile of the surface shown in FIG. 4 taken along the lines 5–5; FIG. 6 is a plan view of the reflector electrode in the chamber shown in FIG. 2; FIG. 7 is a profile of the surface shown in FIG. 6 taken along the lines 7–7 showing a different embodiment of the invention; FIG. 8 is a plan view of a portion of the inner surface of one of the walls of the chamber shown in FIG. 2 illustrating a still another embodiment of the invention; FIG. 9 is a profile of the surface shown in FIG. 8 taken along the lines 9–9; and FIG. 10 is a plan view of a surface treated to produce pyramids on the surface.

In FIG. 1 there is illustrated, in schematic form, an ion implantation apparatus 10 that has a number of sources 12, containing selected materials, coupled to an ion generator or arc chamber 14 shown in greater detail in FIGS. 2, 3 and 4. The purpose of this generator 14 is to produce and maintain a plasma from which a focused beam of ions can be extracted and transported through the implantation system, to a target as will be discussed below. The generated ions are extracted from the chamber 14 through an exit port 16 by suitable electrostatic and/or magnetic means 18 and directed by an acceleration and lens system 19 against the surface of a body 20 into which the ions are to be implanted. Such ion implantation machines have been known and used, by the semiconductor industry for many years and since their general operation and construction is so well known a more detailed description of the overall apparatus and it operation is not deemed necessary.

As shown in greater detail in FIGS. 2 and 3, the ion generation chamber 14, of the present invention is preferably formed of heat resistant material such as Tungsten or Molybdenum and preferably is in the form of a hollow, rectangular parallelepiped which can easily be manufactured. However it should be noted that the chamber 14 could have a tubular or cylindrical form. The chamber 14 as shown has four elongated outer walls, i.e., parallel sides 23 and 24, a bottom 22, a parallel top 25, provided with the exit slot 16, and first and second outer end walls 26 and 27. Within the chamber is a first inner plate 28 positioned parallel to but spaced apart from the first outer end wall 26 a second inner plate 29 is positioned parallel to but spaced apart from the second outer end wall 27, a thermionic cathode 38, preferably formed of tungsten, and an electron reflector assembly 45.

The outer end wall 26 and its adjacent first inner plate 28 are both provided with a pair of holes 30, 31, and 32 and 33 respectively. The holes 30 and 31 in the end wall 26 are in line with the holes 32 and 33 in the first inner plate 28. Tubular, flanged insulators 34, 35, 36 and 37 are each respectively positioned in the holes 30, 31, and 32 and 33 and one lead 38a of the cathode 38 passes, out of the ion generator chamber 14, through the insulators 34 and 35 in the end wall 26 and the inner plate 28 to the positive electrode 41 of a cathode power supply 40. The other end 38b of the cathode 38 passes out of chamber 14 through the insulators 36 and 37 and is coupled to the negative electrode 42 of the cathode power supply 40.

The End wall 27 and it parallel inner wall 29 are each provided with a respective hole 43 and 44 and tubular, flanged insulators 47 and 48 are each respectively positioned in the holes 43 and 44. The electron reflector assembly 45, in the form of a metal disc 50 supported on an extended conductive post 50a, is maintained in the chamber 14, opposite the cathode 38, by passing the post 50a through the insulators 43 and 48. The post 50a, is coupled to the negative electrode 67 of an arc power supply 68 whose positive electrode 69 is coupled to the walls of the ion generation chamber 14. Respective source magnets 60 and 61 are positioned adjacent each respective chamber end 26 and 27 so that the magnetic flux (N to S) therebetween passes the length of the chamber and perpendicular to the reflector plate 50.

The materials to be used to form the plasma can either solid, liquid or gaseous elements or compounds but must be introduced into the chamber 14 in gaseous form. Solid materials with high vapor pressure, e.g., Antimony Tri Fluoride ($SbF_3$) and Indium Tri Chloride ($InCl_3$) are heated in a crucible and thermally vaporized, by resistive or inductive heating. This vaporized material ($InCl_3$ or $SbF_3$) is introduced into the arc chamber together with a flow of inert gas such as Argon. The flow of Argon is maintained until the generated plasma is stabilized. Liquids, e.g., Germanium Tetra Fluoride ($GeF_4$), are also heated until vaporized and the vapor is then introduced into the chamber as a vapor along with a flow of inert gas. Gases, e.g., Boron Tri Fluoride ($BF_3$), Phosphine ($PH_3$), Arsene ($AsH_3$) are also introduced into the chamber 14 along with a flow of inert gas.

As is well known to the art, a selected flow, of the material to be ionized, is introduced into the chamber 14 from its container 12 via a flow regulator valve 62 positioned between the chamber 14 and the container 12. Simultaneously, an inert gas from a separate source 12a is also introduced into the chamber 14. The cathode power supply 40 is turned on and the filament 38 is heated by the current flowing there through. When the filament is tungsten and heated to 2500°C. electrons are thermionically emitted therefrom. Because the chamber walls are connected to the positive electrode of the arc current supply there is created a potential difference of between 30 V and 100 V between the filament and the chamber walls. The electrons from the filament gain energy from this difference in potential and oscillate because of the electromagnetic field created by the source magnets 60 and 61. These oscillating high energy ions collide with the gaseous material introduced into the chamber 14 and ionize the gas and form a plasma. The formed plasma is sustained by current from the arc supply 68 and is controlled by adjusting the filament current and source material pressure inside the chamber and magnet field passing through the chamber. The plasma is self regulating, in the steady slate and any loss of electrons and/or ions from the plasma must be compensated for by the production of an equal number of ions and electrons form new material introduced into the chamber from the source 12. This controlled flow of material from the source 12 in the chamber 14 must be maintained. It is to be further noted that, to maintain the plasma, the arc created in the chamber must also be maintained. Thus the arc power supply must be capable of supplying the arc current requirements of the implanter used which typically ranges between 2 and 4 amperes. Generally the arc current requirements are basically determined by the beam current requirements and depends on the extraction efficiency.

In the chamber all the electrons therein are attracted toward the arc chamber walls which serves as an anode and the ions generated therein are attracted toward the cathode 38. Any ions hitting the cathode will, if they have sufficient energy, dislodge particles from the cathode 38 and these particles can deposit onto the chamber walls. Also it should be noted that the oscillating emitted electrons from the cathode, under the influence of the magnetic field, travel in helical paths. In this way these electrons are provided with longer path lengths resulting in more resident time in the plasma. This longer resident time of the electrons in the plasma increases the probability that the electron will collide with an atom of the introduced gas and ionize it.

The electron reflector 50, opposite to the cathode 38, is held negative with respective to the chamber walls and reflects any electrons directed toward it back into the plasma further increasing the probability that ions will be created. Positive ions are extracted from the plasma through the beam exit slot 16 in the top of the chamber by an extraction electrode 18 negatively biased at between −5 KeV and −40 KeV. The ions so extracted are formed into a beam by the lens system 19 against the surface of a body 20 into which the ions are to be implanted.

As is well known to the art, the minimum size of the chamber is established by Debye's length, i.e., a measure of the mean separation of the ions and electrons within the plasma due to random thermal motion. A plasma cannot exist in a chamber less than the Debye's length. The maximum size of the chamber is established by the efficiency of ionization within the chamber. Large chambers not only require higher pressures and more feed material but also encounter problems in the containment of the plasma and all of these elements affect the efficiency of ionization of the gas in the chamber.

The gaseous material, from which the plasma is formed, deposits or condenses as a metal onto the chamber walls each time it is introduced in the chamber. These deposits are due to a number of different conditions, such as, the amount of gas flow, the gas pressure, the gas temperature, the temperature differential between the gas and the chamber walls and etc. The materials so deposited can consist not only of atoms or molecules of the gas being ionized can also include material sputtered from the thermionic cathode and from the chamber walls.

In the prior art, the interior of the walls of the chamber were provided with a highly polished surface, theses highly polished walls provided a particularly conductive environment for the formation of a metallic layer having a uniform grain or crystalline growth usually produced as dendrites. In the prior art chambers, this highly polished surface caused any such deposit to have very poor adhesion with the walls. Moreover, the high temperatures in the chamber, i.e., 1000°C. and 1200°C., further reduces this already poor adhesion and, as the deposit thickens, the deposit peels away from the polished chamber walls in the form of large flakes. If a flake, sufficiently large enough to span adjacent coils on the filament, falls onto the coils of the filament, the amount of electrons that can be emitted from the filament is reduced. Such a flake can also form hot spots on the filament coil and cause premature failure of the emitter. Even larger flakes can short circuit the filament or the reflector to the chamber walls causing a complete collapse of the generated plasma in the chamber.

The present invention prevents such flakes from growing large enough to cause such problems from occurring within an ion generation chamber.

The present invention accomplishes this by providing the interior walls of the chamber with a roughened surface that impedes the formation of flakes of a size sufficient to cause the above described problems. The present inventors have found that, if the surface has a constantly changing profile, with sharp or abrupt angles between the changes in a profile, then peeling deposits will not create flakes large enough to cause the problems found in prior art generation chambers as discussed above.

This desirable feature, of the present invention is realized because the present invention breaks the surface of the areas by introducing sharply changing profiles in the surfaces where such deposits occur.

FIG. 4 is a plan view of a portion of the inner surface of one of the walls of the chamber shown in FIG. 2 illustrating a first embodiment of the invention; FIG. 5 is a profile of the surface shown in FIG. 4 taken along the lines 5–5; FIG. 6 is a plan view of the reflector electrode in the chamber shown in FIG. 2; FIG. 7 is a profile of the surface shown in FIG. 6 taken along the lines 7–7 showing a different embodiment of the invention; FIG. 8 is a plan view of a portion of the inner surface of one of the walls of the chamber shown in FIG. 2 illustrating a still another embodiment of the invention; FIG. 9 is a profile of the surface shown in FIG. 8 taken along the lines 9–9; and FIG. 10 is a plan view of a surface treated to produce pyramids on the surface.

As discussed above the inner surfaces of all the side walls, the top, the bottom and the end walls, both sides of each interior end wall and the inwardly facing side of the reflector plate are all roughened in accordance with the present invention.

As shown in FIGS. 4 and 5, these surfaces are roughened by forming a first plurality of parallel grooves 70 in one direction across the surface and then rotating the plate 90 degrees and forming a second plurality of grooves 71 perpendicular to the first set of grooves to leave a multitude of mesas or knurls 73 extending above the lower surface of the grooves. As shown in FIG. 5, the grooves 70 and 71 are square cut, by a suitable saw, such that the formed knurls 73 have shoulders at ninety degrees to the formed cuts. FIG. 6 shows an alternate embodiment in which the grooves 70 and 71 have a dove tail configuration so that the formed knurls 73 having a re-entrant angle with the walls of the formed grooves.

This knurling divides the interior surfaces of the walls of the chamber into a plurality of small knurls or knobs. The size of any formed knurl must be such that deposit formed thereon will be smaller than the distances between the filament coils or the distances between the filament and the interior walls of the chamber, or smaller than the distance between the reflector electrode and the interior walls of the chamber to assure that any formed flakes will not form a short circuit between the walls and the electrodes in the chamber. Thus, the knurling creates a constantly changing profile to prevent continuous deposits from forming on said interior walls.

With a wall thickness of 0.250 inches, cuts with a depth of 1/32 inch and having a pitch, i.e., the spacing between the cuts, spaced 1/8 inches apart produced good results.

Testing found that the depth of the cut preferably should be between 12 and 20% of the thickness of the wall plates for best results. The cuts or grooves can be made deeper but the probability of cracks occurring in the structure, especially at the high temperatures used in such chambers, increases significantly as the cut deepens. It was also found that good results can also be achieved when the pitch of the knurl ranges between 7/64 inches and 5/32 inch.

In deciding the actual pitch to be used, the distance between the cathode leads should be taken into consideration to create at least one knurl in between the insulators through which the cathode leads pass. Thus the distance between the center of the one leg of the cathode, to the chamber wall (across the cathode insulators) should decide the maximum allowable pitch, as so that there is at least one groove between the cathode leads. This helps prevent any shorts forming between the cathode leads or between the cathode leads and the chamber wall.

Other factors to consider are that as the pitch becomes larger, then formed flakes become correspondingly larger, but the selected pitch is best determined by the position of cathode leads and/or the spacing of the reflector from the walls of the chamber. It should also be noted that the size of the pitch as well as the depth of the cuts directly relates to the ease of cleaning the chamber. Cleaning of the chamber increases in difficulty as the pitch decreases and the depth of the cut increases.

FIG. 8 is a plan view of a portion of the inner surface of one of the walls of the chamber shown in FIG. 2 illustrating a still another embodiment of the invention; FIG. 9 is a profile of the surface shown in FIG. 8 taken along the lines 9–9; and FIG. 10 is a plan view of a surface treated to produce pyramids on the surface.

As shown in FIGS. 8 and 9, the interior surfaces of the chamber can be roughened by forming a plurality of parallel triangular grooves 90 across the surface parallel to the shortest dimension of the walls. These triangular grooves 90 create a series of serrations or saw tooth profiles. Preferably these grooves 90 are formed so that their sides each form an angle of ninety degrees or less with any adjacent side. Thus side 91 forms an angle of ninety degrees or less with either of its adjacent sides 92 and 93.

FIG. 10 is a plan view of a surface treated to produce pyramids on the surface. This pyramidal surface is realized by forming triangular grooves 95 in one direction and then turning the surface and forming triangular grooves 96 perpendiculars to the previously formed groves 95.

The sharply changing profile of the present invention thus prevents the creation of flakes of deposited material of a size sufficient to cause problems in the chamber. The knurl on the surface generally limits the size and growth of the deposits on the walls and does so by minimizing the size of a continuous flat surface for the deposit to form on. In the unlikely event that a deposit does extend around an edge formed in the surface, the edge introduces a thinning of the deposit which acts as a fracture line in the deposit. In such a case, such a deposit will, as it peels away from a surface of the knurl, fracture at this line reducing the size of the flake and thus rendering it incapable of causing the problems found in the prior art, as above described.

This fracturing of the flakes occurs because the amount of material that becomes deposited on a vertical edge of a surface profile, or at a discontinuity on the surface is thinner than the deposits on a flat surface. Moreover, as is well known, any sharp corner is mechanically weak because of the stresses accumulated therein. Therefore when any flake that might continue around such a corner begins to peel off the surface it will tend to crack at the corner, i.e., at any abrupt change in direction of a surface profile.

Thus the present invention assures that any flake created in a chamber of the present invention is not large enough to short the either the filament or the reflector plate. In this way the present invention increases the operating time the chamber can be used between cleansing.

Still other surface profiles that can be used to realize the present invention will now be obvious to one skilled in the art.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. In an ion beam implantation apparatus;
   an ion generation chamber having a generally hollow interior formed from a pair of parallel walls, a top plate, a bottom plate, a first end wall and an opposing end wall;
   each of said pair of parallel walls, top plate, bottom plate, first end wall and opposing end wall each having an interior surface, facing the interior of said chamber, and an exterior surface;
   a cathode positioned in said interior adjacent said first end wall and a reflector electrode positioned adjacent said opposite end wall;
   an ion beam extraction slot in said top plate;

opposing magnets positioned outside of said chamber so that the direction of the magnetic flux between said magnets is perpendicular to said end walls;

means for introducing a gaseous material to be ionized into said chamber;

power supplies coupled to said cathode, said chamber walls, and said reflector plate to ionize said gaseous material in said chamber; and the interior surfaces of said pair of parallel walls, a top plate, said bottom plate, said first end wall and said opposing end wall all having a roughened surface finish.

2. The apparatus of claim 1 wherein said interior surfaces are each provided with a constantly changing profile to prevent continuous deposits from forming on said interior walls.

3. The apparatus of claim 1 wherein said interior wall surfaces are provided with abrupt angles forming the changes in profile, then peeling deposits will not create flakes large enough to cause the problems found in prior art generation chambers as discussed above.

4. The apparatus of claim 1 wherein:

each of said surfaces are roughened by forming a first plurality of parallel cuts in one direction across each of said surfaces; and rotating the plate ninety degrees and forming a second plurality of cuts or grooves perpendicular to the first plurality of parallel cut to leave a multitude of knurls between said cuts.

5. The apparatus of claim 4 wherein said grooves have parallel sides perpendicular to said interior surface.

6. The apparatus of claim 4 wherein said grooves have a dovetail cross-section.

7. The apparatus of claim 4 wherein said grooves have a triangular cross-section.

8. The apparatus of claim 4 wherein said grooves have a depth of $1/32$ inch and are spaced $1/8$ inches apart.

9. The apparatus of claim 4 wherein said grooves have a depth of between 12 and 20% of the thickness of the walls of the chamber and said grooves are spaced apart between $7/64$ inches and $5/32$ inches.

10. An ion implantation apparatus comprising;

an arc chamber having inwardly facing surfaces;

said chamber further having two electrodes in the chamber, an inlet for introducing a feed material to be ionized, an outlet for ionizing the feed material within the chamber; and said inner surfaces having roughened surfaces to prevent the feed material from forming deposits of said feed materials on said surface sufficiently large enough to cause short circuits between said electrodes and said chamber walls if said deposits peel off said inner surfaces.

11. An ion implantation apparatus comprising;

an arc chamber in the form of a having inwardly facing surfaces;

said chamber further having two electrodes in the chamber, an inlet for introducing a feed material to be ionized, an outlet for ionizing the feed material within the chamber; and said inner surfaces having a series of triangular grooves formed in a direction parallel to the smallest dimension of said hollow rectangular parallelepiped to prevent any material introduced therein from forming deposits on said surfaces sufficiently large enough to shorten the useful life of said chamber if said deposits peel off said inner surfaces.

* * * * *